(12) United States Patent
Kook

(10) Patent No.: US 12,727,095 B2
(45) Date of Patent: Sep. 1, 2026

(54) ELECTRONIC DEVICES AND ELECTRONIC DEVICE SYSTEMS

(71) Applicant: Samsung Electronics Co., Ltd., Suwon-si (KR)

(72) Inventor: Jungkyu Kook, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 54 days.

(21) Appl. No.: 18/402,587

(22) Filed: Jan. 2, 2024

(65) Prior Publication Data

US 2024/0260205 A1 Aug. 1, 2024

(30) Foreign Application Priority Data

Jan. 30, 2023 (KR) ........................ 10-2023-0011867

(51) Int. Cl.

| | |
|---|---|
| ***H05K 5/00*** | (2025.01) |
| ***H01R 12/71*** | (2011.01) |
| ***H01R 12/72*** | (2011.01) |
| ***H05K 1/14*** | (2006.01) |

(52) U.S. Cl.

CPC ......... *H05K 5/0069* (2013.01); *H01R 12/716* (2013.01); *H01R 12/724* (2013.01); *H05K 1/141* (2013.01); *H05K 5/006* (2013.01)

(58) Field of Classification Search

CPC .. H01R 12/716; H01R 12/718; H01R 12/724; H05K 1/141; H05K 5/006; H05K 5/0069

See application file for complete search history.

(56) References Cited

U.S. PATENT DOCUMENTS

| | | | | |
|---|---|---|---|---|
| 7,050,388 | B2 | 5/2006 | Kim et al. | |
| 8,397,013 | B1 * | 3/2013 | Rosenband .............. | G11C 5/02 711/111 |
| 2008/0174595 | A1 | 7/2008 | Jatou et al. | |
| 2010/0283894 | A1 | 11/2010 | Horan et al. | |
| 2013/0077813 | A1 | 3/2013 | Minoo et al. | |
| 2016/0120034 | A1 | 4/2016 | Chen et al. | |
| 2019/0304513 | A1 * | 10/2019 | Chang ...................... | G11C 7/10 |
| 2020/0037448 | A1 | 1/2020 | Kim et al. | |
| 2020/0295474 | A1 * | 9/2020 | Vockenberger ...... | H01R 4/4821 |
| 2024/0260205 | A1 * | 8/2024 | Kook .................. | H01R 12/716 |

FOREIGN PATENT DOCUMENTS

| | | | |
|---|---|---|---|
| KR | 10-2015-0081578 | A | 7/2015 |

* cited by examiner

*Primary Examiner* — Robin J Mishler

(74) *Attorney, Agent, or Firm* — Harness, Dickey & Pierce, P.L.C.

(57) ABSTRACT

Provided is an electronic device system including a first electronic device including a first substrate, a second electronic device including a second substrate, and a data transferer including a first connector and a second connector, the data transferer configured to connect the first electronic device and the second electronic device, the first substrate including the first recess area and the second recess area spaced apart from the first recess area, and the first recess area and the second recess area are at a same depth.

19 Claims, 13 Drawing Sheets

11 DISPLAY APPARATUS
12
32
31
OPTICAL CABLE
33
21 SOURCE DEVICE
23
POWER CABLE
22
24

210
Recess_1
Recess_2
L1
L2
L3
L4
L5
L6
L7
A
A'
W1
Z
Y

ELECTRONIC DEVICES AND ELECTRONIC DEVICE SYSTEMS

CROSS-REFERENCE TO RELATED APPLICATION

This application is based on and claims priority under 35 U.S.C. § 119 to Korean Patent Application No. 10-2023-0011867, filed on Jan. 30, 2023, in the Korean Intellectual Property Office, the disclosure of which is incorporated by reference herein in its entirety.

BACKGROUND

The inventive concepts relate to electronic devices and electronic device systems, and more specifically, to the structure of a substrate included in the electronic devices.

Electronic devices such as television (TV), a personal computer (PC), and a tablet PC may be connected to various external devices. The electronic device may be connected to an accessory device or a Universal Seral Bus (USB) storage device to transmit and receive signals necessary for executing various functions.

Connecting components such as a cable or gender may be used to connect the electronic device to external devices. The connecting component may connect connectors having different specifications to match corresponding pins.

SUMMARY

The inventive concepts provide electronic device systems whereby electro-magnetic interference (EMI) issues of electronic devices that use high-speed interfaces may be addressed.

According to some aspects of the inventive concepts, there is provided an electronic device system, the electronic device system including a first electronic device including a first substrate, a second electronic device including a second substrate, and a data transferer including a first connector and a second connector, the data transferer configured to connect the first electronic device to the second electronic device, wherein the first substrate may include a first recess area and a second recess area spaced apart from the first recess area, and the first recess area and the second recess area may be provided with a same depth.

According to some aspects of the inventive concepts, there is provided an electronic device including a substrate, a main processor chip on the substrate, and an external device connecting portion on the substrate, the external device connecting portion may be in the first recess area of the substrate, the main processor chip may be in the second recess area of the substrate, and the first recess area and the second recess area may be formed by recessing an uppermost layer of the substrate and a layer below the uppermost layer.

According to some aspects of the inventive concepts, there is provided an electronic device including a main processor chip configured to drive the electronic device, an external device connecting portion configured to connect the electronic device to an external electronic device, and a substrate including a plurality of recess areas, wherein the plurality of recess areas may include at least one first recess area in which the external device connecting portion is disposed, and at least one second recess area in which the main processor chip is disposed, and the number of the first recess areas may be the same as the number of the second recess areas.

BRIEF DESCRIPTION OF THE DRAWINGS

Example embodiments will be more clearly understood from the following detailed description taken in conjunction with the accompanying drawings in which.

DETAILED DESCRIPTION

Hereinafter, some example embodiments of the inventive concepts will be described with reference to the accompanying drawings.

Figure 1:
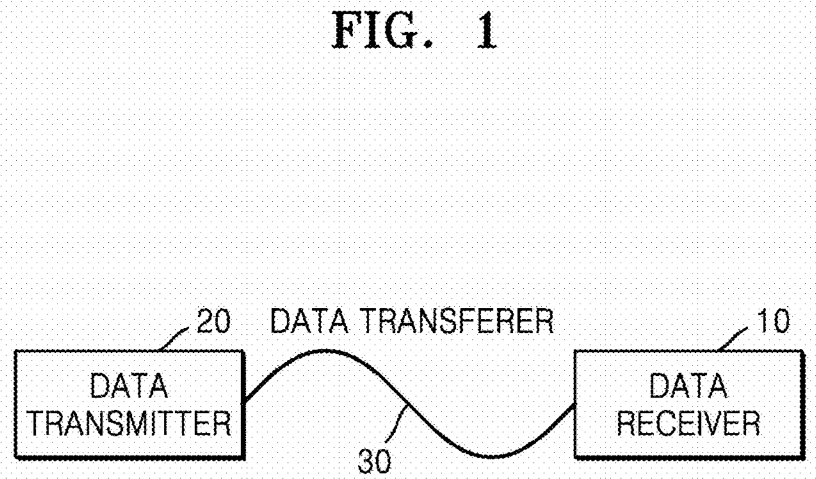
FIG. 1 is a reference diagram for explaining concepts of some example embodiments.

FIG. 1 is a reference diagram for explaining concepts of some example embodiments.

Referring to FIG. 1, a system according to some example embodiments may include a data receiver 10, a data transmitter 20, and a data transferer 30.

The data receiver 10 may receive data from the data transmitter 20 through the data transferer 30 and, for example, display or reproduce the received data. The data receiver 10 may include a connecting portion that is connectable to the data transferer 30. This connecting portion may also be referred to as an external device connecting portion. The data receiver 10 may include a multimedia playback device such as a television, an audio device, or the like.

The data transmitter 20 may transmit data to the data receiver 10 through the data transferer 30 depending on a request from the data receiver 10 or a decision of the data transmitter 20. The data transmitter 20 may include a connecting portion capable of being connected to the data transferer 30. The connecting portion may mean an external device connecting portion. The data transmitter 20 may include a multimedia supply device such as a set-top box or data box.

According to some example embodiments, the connecting portion through which the data receiver 10 connects with the data transferer 30 and the connecting portion through which the data transmitter 20 connects with the data transferer 30 may be formed in a recess area of a substrate which each of the data receiver 10 and the data transmitter 20 includes. This will be described in detail below with reference to FIG. 4.

The data transferer 30 may transfer data transmitted from the data transmitter 20 to the data receiver 10. The data transferer 30 may include the connecting portion for connecting with the data transmitter 20 and the connecting portion for connecting with the data receiver 10. The data transferer 30 may include, for example, an optical cable.

The data transferer 30 may include one or more signal lines for transferring data signals and one or more power lines for transferring power. The one or more signal lines may include optical fiber, and the one or more power lines may include copper wire. According to the inventive concepts, a signal between the external device connecting portion connected to the data transferer 30 and a main processor chip on the substrate included in the data transmitter 20 or the data receiver 10 may be wired as using an inner layer without a via hole.

In this specification, both the data transmitter 20 and the data receiver 10 may be referred to as an electronic device, and a device external to the electronic device may be referred to as an external device. According to some example embodiments, the data transferer 30 may be a high-speed interface such as High-Definition Multimedia Interface (HDMI), DisplayPort (DP), or the like. According to some example embodiments, the data transferer 30 may be either HDMI 2.0 or HDMI 2.1. According to some example embodiments, the data rate of HDMI 2.0 may be exactly or about 10 Giga bit per see (Gbps). According to some example embodiments, the data transferer 30 may refer to a device that transmits data or power at a speed of exactly or about 8 Gbps to exactly or about 48 Gbps, or more.

Figure 2:
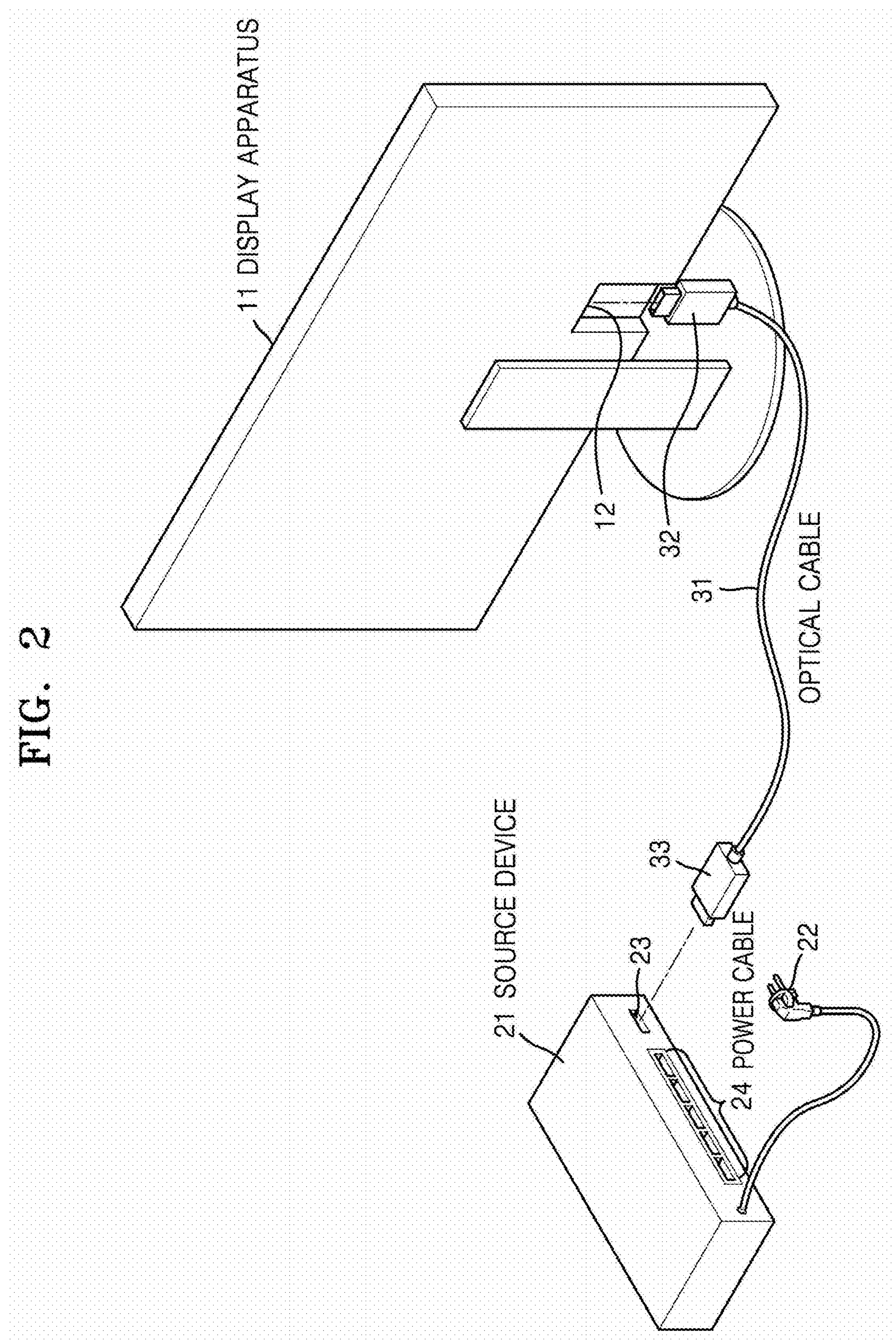
FIG. 2 is a diagram for explaining data transfer between a data transmitter and a data receiver, according to some example embodiments.

FIG. 2 is a diagram for explaining data transfer between a data transmitter and a data receiver, according to some example embodiments.

Referring to FIG. 2, a display apparatus 11 is shown as an example of the data receiver 10, a source device 21 is shown as an example of the data transmitter 20, and an optical cable 31 is shown as an example of the data transferer 30.

In some example embodiments, the display apparatus 11 may be implemented as a television that displays broadcast images based on broadcast signals/broadcast information/broadcast data received from transmission equipment of a broadcasting station. The display apparatus 11 may display images such as moving pictures, still images, applications, on-screen display (OSD), graphic user interface (GUI) for controlling various operations, etc. based on signals/data of various formats that are displayed as images in addition to television (TV) signals. The display apparatus 11 may include a port 12 for physical and electrical connection with the optical cable 31. According to some example embodiments, the port 12 may be an external device connecting portion, and may be disposed in a first recess area to be described later.

The source device 21 may be manufactured to be portable for easy transport and replacement, and transmit data received from various sources to the display apparatus 11 through the optical cable 31. The source device 21 may include a port 23 for physical and electrical connection with the optical cable 31. The source device 21 may include one or more input/output ports 24 to receive data from various image supply sources in addition to the optical cable port 23. According to some example embodiments, the ports 23 and 24 may be external device connecting portions and may be disposed in the first recess area to be described later.

In addition, the source device 21 may include a power cable 22 for receiving power input. The power supplied from the power cable 22 may be not only supplied to each component of the source device 21 but also supplied to each component of the display apparatus 11 to be used to operate the display apparatus 11 when the display apparatus 11 is connected through the optical cable 31.

The optical cable 31 may include a first connector 32 for physical and electrical connection with the display apparatus 11 and a second connector 33 for physical and electrical connection with the source device 21. The optical cable 31 may receive data from the source device 21 through the second connector 33 and transmit the received data to the display apparatus 11 through the first connector 32. However, the inventive concepts are not limited thereto, and data may move in the reverse direction as well, for example, the optical cable 31 may receive data from the display apparatus through the first connector 32 and transmit the received data to the source device 21 through the second connector 33.

The optical cable 31 according to the some example embodiments may include a plurality of signal lines for transmitting data and one or more power lines.

In some example embodiments according to FIG. 2, the optical cable 31 may provide power input from the source device 21 to the display apparatus 11 by using one or more power lines, but may also be configured to provide power input from the display apparatus 11 to the source device 21 by using one or more power lines of the optical cable 31 in some example embodiments.

Figure 3:
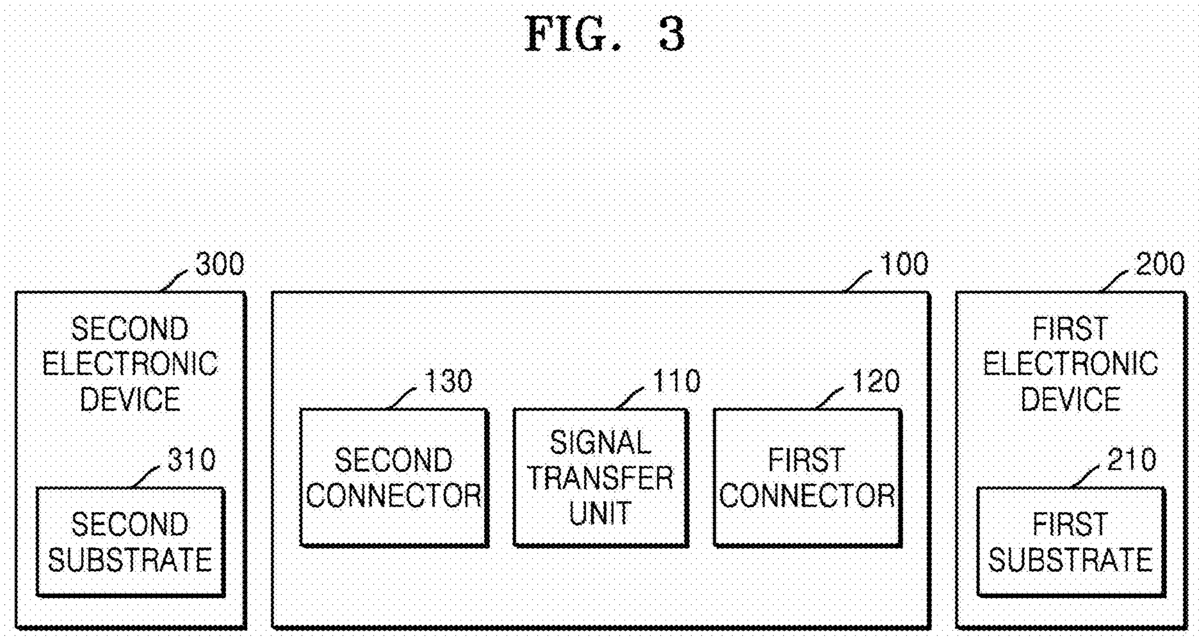
FIG. 3 illustrates a system including a data transferer and external electronic devices connected to the data transferer, according to some example embodiments.

FIG. 3 shows an example of a system including an optical signal transferer and external devices connected to the optical signal transferer, according to some example embodiments.

Referring to FIG. 3, the system may include an optical signal transferer 100, a first electronic device 200, and a second electronic device 300. According to some example embodiments, the optical signal transferer 100 may correspond to the optical cable 31 of FIG. 2, the first electronic device 200 may correspond to the display apparatus 11, and the second electronic device 300 may correspond to the source device 21. However, the inventive concepts are not limited thereto, and the first electronic device 200 and the second electronic device 300 may be any one of various electronic devices accordingly.

The optical signal transferer 100 may include a signal transfer unit 110 including one or more signal lines for transmitting signals and one or more power lines for transmitting power, between the first electronic device 200 and the second electronic device 300, a first connector 120 positioned at one end of the signal transfer unit 110 and connected to the first electronic device 200, and a second connector 130 positioned at the other end of the signal transfer unit 110 and connected to the second electronic device 300.

According to some example embodiments, the signal transfer unit 110 may transmit an optical signal to the second electronic device 300 in response to a power-on input of the first electronic device 200, and transmit power and data received from the second electronic device 300 in response to detection of the transmitted optical signal, to the first electronic device 200 by using the one or more power lines and the one or more signal lines.

According to some example embodiments, the signal transfer unit 110 may include at least one standby power line and at least one main power line, and in response to the above detection signal recognition, the at least one main power line may be configured to transmit main power supplied from the second electronic device 300 to the first electronic device 200.

According to some example embodiments, the signal transfer unit 110 may block the optical signal transmitted to the second electronic device 300, in response to a power off input of the first electronic device 200, and may block power supply from the second electronic device 300, in response to the recognition of the blocking of the optical signal by the second electronic device 300.

According to some example embodiments, each of the first connector 120 and the second connector 130 may include one or more printed circuit boards (PCBs), and one or more signal lines and one or more power lines may be spaced apart from each other on each PCB.

According to some example embodiments, the first electronic device 200 may include an interface for connection with the optical signal transferer 100 to receive data and power from the second electronic device 300, a power controller for controlling power received from the optical signal transferer 100, and a main processor chip for controlling driving of the first electronic device 200, and the main processor chip may control an interface to generate an optical signal in the optical signal transferer 100 in response to a power-on input of the first electronic device 200, receive power and data from the second electronic device 300 through the optical signal transferer 100 in response to the generated optical signal, and process the received data. The first electronic device 200 may include a first substrate 210, and the main processor chip may be disposed on the first substrate 210. The first substrate 210 may be structured to include a plurality of recess areas. An external device connecting portion that is connectable to the first connector 120 may be disposed in a first recess area of the first substrate 210. The main processor chip may be disposed in a second recess area of the first substrate 210. In the inventive concepts, descriptions of a chip including a main processor or a main processor chip may be used interchangeably. According to some example embodiments, the main processor chip may be a Digital Television System-on-Chip (DTV-SoC).

According to some example embodiments, the second electronic device 300 may include an interface for connection with the optical signal transferer 100 to transmit data and power from the second electronic device 300 to the first electronic device 200, a power controller to control the power supplied to the optical signal transferer 100, and the main processor chip. The second electronic device 300 may include a second substrate 310, and the main processor chip may be disposed on the second substrate 310. The second substrate 310 may be provided in a structure that includes a plurality of recess areas. An external device connecting portion that is connectable to the second connector 130 may be disposed in a first recess area of the second substrate 310. The main processor chip may be disposed in a second recess area of the second substrate 310. However, the inventive concepts are not limited thereto, and data and/or power and the like may move in the reverse direction as well, for example, from the first electronic device 200 to the second electronic device 300.

Hereinafter, perspective views and cross-sectional views corresponding to some example embodiments of the first substrate 210 or the second substrate 310 are described. However, it should be noted that the description of the first substrate 210 may be equally applied to the second substrate 310, and the description of the second substrate 310 may also be equally applied to the first substrate 210.

Figure 4:
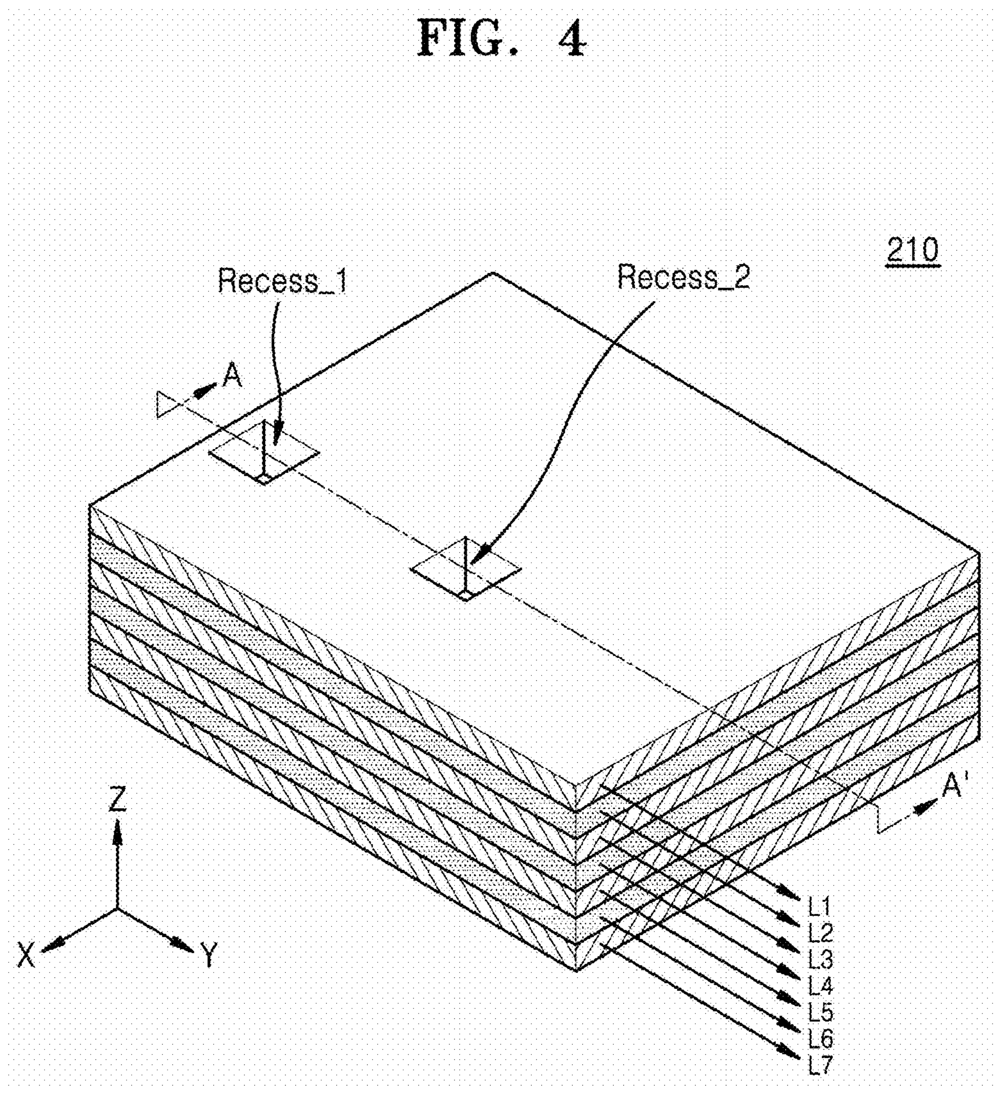
FIG. 4 is a perspective view of a substrate according to some example embodiments.

FIG. 4 is a perspective view of a substrate according to some example embodiments. According to some example embodiments, the substrate of FIG. 4 may be a perspective view of the first substrate 210 included in the first electronic device 200 of FIG. 3.

The first substrate 210 of FIG. 4 may be a structure in which a plurality of layers L1, L2, L3, L4, L5, L6, and L7 are stacked. According to an example, the first substrate 210 may be a structure in which conductive layers L1, L3, L5, and L7 and insulating layers L2, L4, and L6 are alternately stacked. FIG. 4 shows that seven layers are stacked, but the first substrate 210 may be a structure in which seven or more layers are stacked, or a structure in which seven or fewer layers are stacked.

The conductive layer L1 may be the uppermost layer of the first substrate 210. The insulating layer L2 may be disposed under the uppermost conductive layer L1. According to some example embodiments, the conductive layers L1, L3, L5, and L7 and the insulating layers L2, L4, and L6 may have the same or substantially the same thickness. However, the inventive concepts are not limited thereto, and the layers L1 to L7 may have different thicknesses. According to some example embodiments, the conductive layers L1, L3, L5, and L7 may include conductive materials. The insulating layers L2, L4, and L6 may include insulating materials. According to some example embodiments, the first substrate 210 may be a PCB.

The first substrate 210 of FIG. 4 may include a first recess area Recess_1 and a second recess area Recess_2. In the inventive concepts, a recess area may refer to a region formed by recessing a portion of the first substrate 210. Referring to FIG. 4, the first recess area Recess_1 and the second recess area Recess_2 have the same or substantially the same depth. In other words, the first recess area Recess_1 and the second recess area Recess_2 may be formed by being recessed to the same or substantially the same depth. In the inventive concepts, the recess area may refer to a region formed by cutting a thickness corresponding to the uppermost conductive layer L1 and the insulating layer L2 disposed thereunder. However, the inventive concepts are not limited thereto, and the first recess area Recess_1 and the second recess area Recess_2 may have different depths, for example, at different layers or different depths in the same layer, for example, a midpoint of L2 and a bottom of L2, respectively.

Figure 5A:
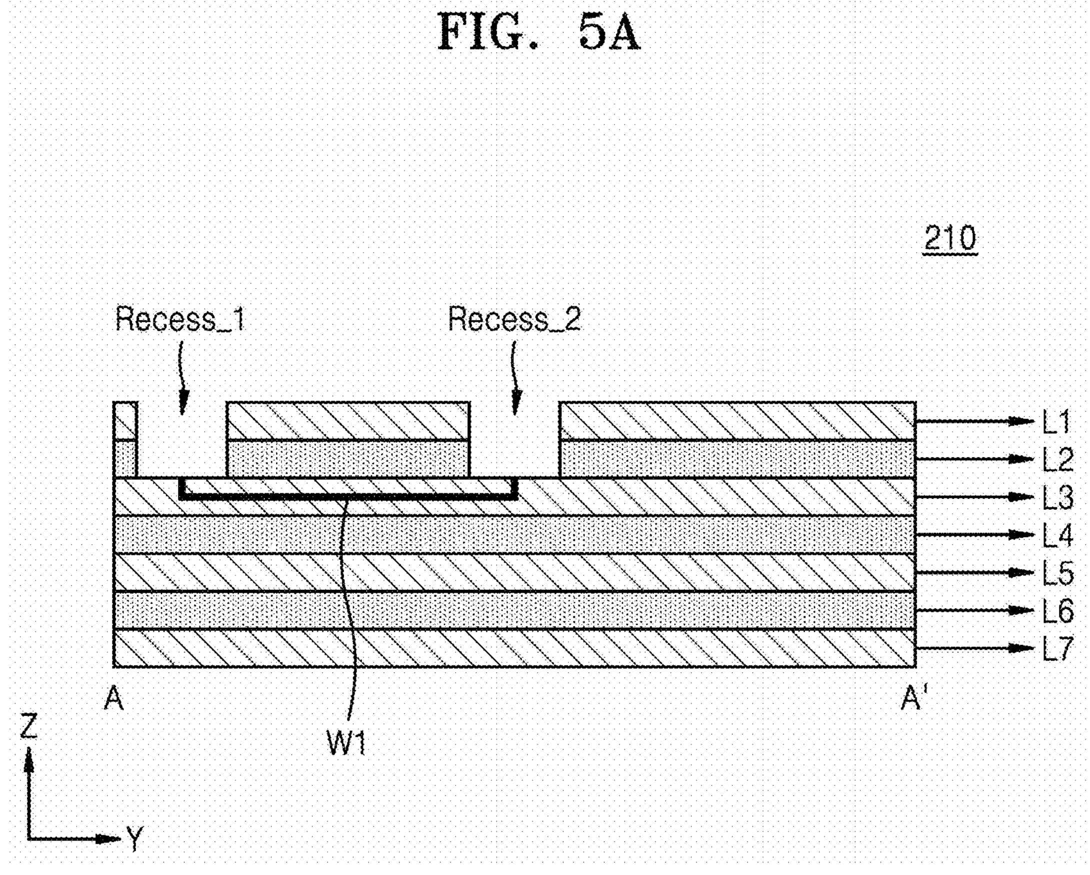
FIG. 5A is a cross-sectional view of a substrate according to some example embodiments of FIG. 4.
Figure 5B:
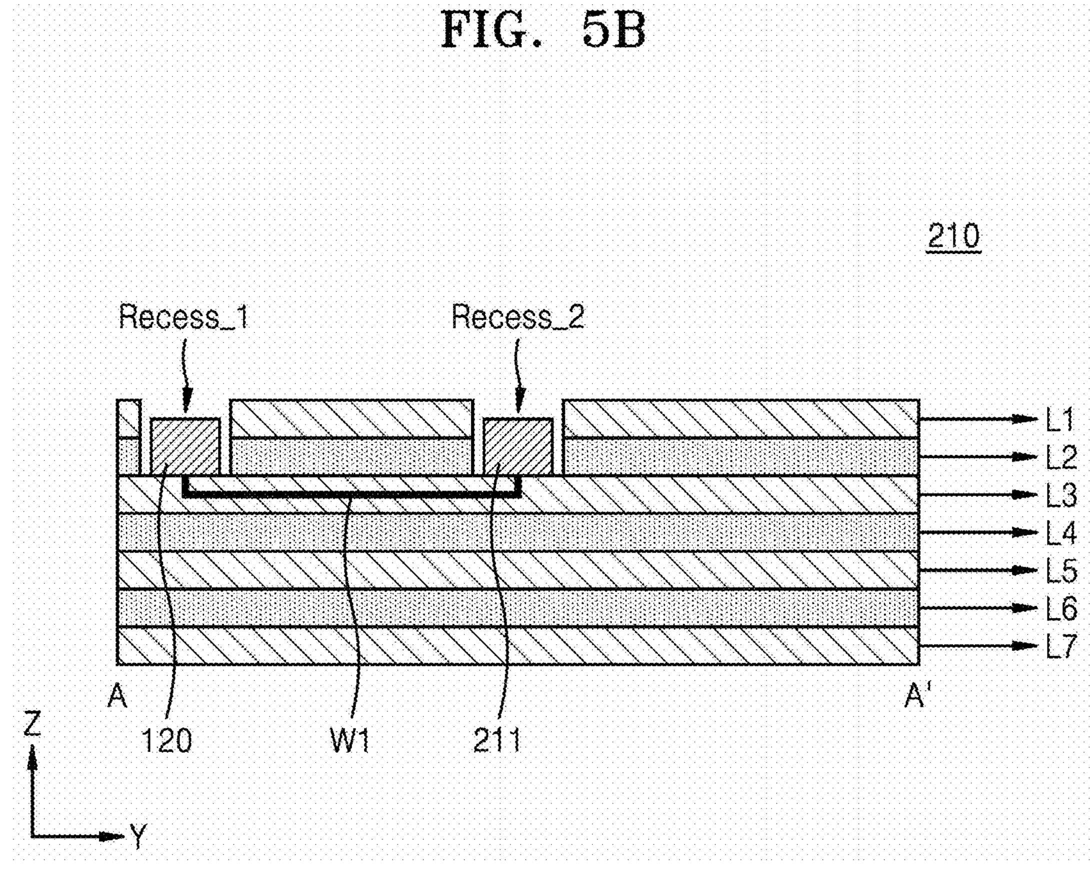
FIG. 5B is a cross-sectional view of a substrate according to some example embodiments of FIG. 4.

The substrate structure according to the inventive concepts will be described in more detail with reference to FIGS. 5A and 5B. FIGS. 5A and 5B are cross-sectional views of the substrate of FIG. 4 taken along line A-A'.

Referring to FIG. 5A, a view is shown in a state in which no components are disposed in each of the first and second recess areas Recess_1 and Recess_2. Referring to FIG. 5B, some example embodiments is shown, in which an external device connecting portion and a main processor chip are disposed in each of the first and second recess areas Recess_1 and Recess_2 of FIG. 5A.

Referring to FIGS. 5A and 5B, the first recess area Recess_1 and the second recess area Recess_2 are spaced apart from each other in a first direction. According to some example embodiments, the first direction may mean a Y-axis direction.

According to some example embodiments, an external device connecting portion may be disposed in the first recess area Recess_1. According to some example embodiments, the first connector 120 of FIG. 3 may be mounted at the external device connecting portion. According to some example embodiments, a device capable of transmitting data or power at a speed of 8 gigabytes or more to a first electronic device may be connected to the external device connecting portion. In other words, the first recess area Recess_1 may be a region where the external device connecting portion for connecting the first electronic device including the first substrate 210 to an external device is disposed. The first recess area Recess_1 may further include a structure into which the first connector 120 of FIG. 3 is mounted.

In the inventive concepts, the meaning of the external device connecting portion being disposed in the first recess area Recess_1 may be the same as the meaning of the external device connecting portion being mounted in the first recess area Recess_1.

A main processor chip 211 may be disposed in the second recess area Recess_2. The second recess area Recess_2 may be a region where the main processor chip 211 for driving the first electronic device including the first substrate 210 is disposed.

Referring to FIGS. 5A and 5B, the first recess area Recess_1 and the second recess area Recess_2 may be regions formed by cutting the first conductive layer L1 and the first insulating layer L2. The second conductive layer L3 may be disposed under the first and second recess areas Recess_1 and Recess_2.

The first recess area Recess_1 and the second recess area Recess_2 may be formed to a depth equal or substantially equal to the thickness of the first conductive layer L1 and the first insulating layer L2. According to some example embodiments, the first recess area Recess_1 and the second recess area Recess_2 may have the same or substantially the same depth.

Referring to FIGS. 5A and 5B, a metal wiring W1 may be located in the second conductive layer L3. The metal wiring W1 may refer to a wiring connecting the external device connecting portion disposed in the first recess area Recess_1 with the main processor chip 211 disposed in the second recess area Recess_2. According to some example embodiments, the metal wiring W1 may be provided by a length corresponding to a distance between the first recess area Recess_1 and the second recess area Recess_2.

According to some example embodiments, the main processor chip 211 for driving the electronic device and the external device connecting portion on which the first connector 120 of the external device is mounted may be formed as a single-layer structure on the first substrate 210, and may be wired as an inner layer without a via hole through an inner layer signal by positioning the main processor chip 211 and the external device connecting portion on the inner layer. In the inventive concepts, the inner layer signal may mean a signal connected within the inner layer without passing through a via hole. In the substrate structure according to the inventive concepts, crosstalk and (EMI) issues due to reflections from via hole and reference ground asymmetry may be addressed. That is, the external device connecting portion on which the first connector 120 of the external device is mounted may be in direct contact with one another.

According to some example embodiments, main processor chip 211 included in the second recess area Recess_2 is illustrated, but another controller or the like may also be disposed in addition to the main processor chip. An example of the external device connecting portion to be disposed in the first recess area Recess_1 may be a high-speed interface connector such as an HDMI connector or a DP connector.

According to some example embodiments, a component corresponding to the main processor chip mounted on a substrate may be mounted on the substrate with a single-layer structure, that is, a recess structure in the shape of a groove. According to some example embodiments, a component corresponding to a connector for a high-speed interface may be mounted on a substrate with a single-layer structure, that is, a recess structure with a grooved shape. Signals between a main processor chip and a connector may be wired through the inner layer without using via hole, and the upper and lower regions of the signals wired in the inner layer may be covered and provided for a return path.

According to some example embodiments, a signal wiring for a high-speed signal may be designed in the form of an inner layer. According to some example embodiments, it is possible to cut out a portion of substrate located on the top surface and wire in the inner layer without via hole. According to some example embodiments, the inner layer wiring may be accomplished without via hole by providing a direct connection, which can improve reflection, crosstalk, and EMI characteristics of signals.

Figure 6:
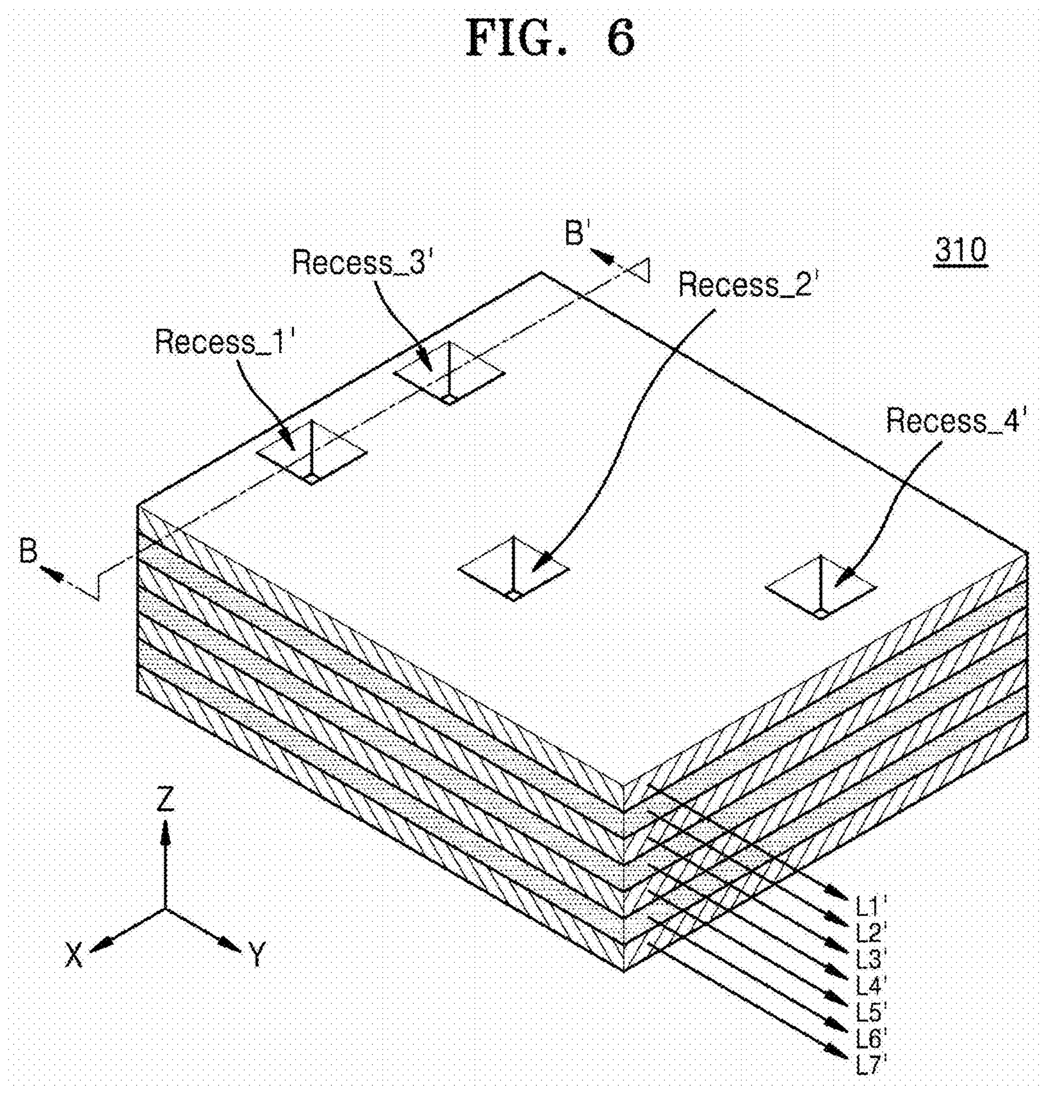
FIG. 6 is a perspective view of a substrate according to some example embodiments.
Figure 7:
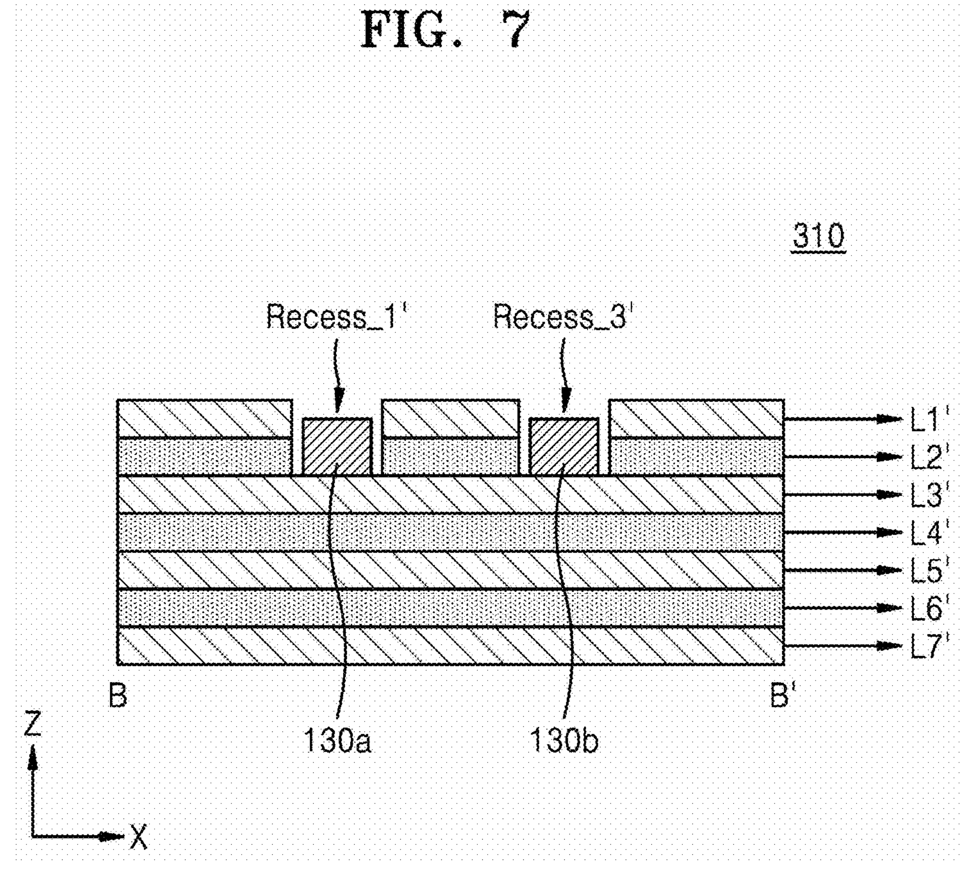
FIG. 7 is a cross-sectional view of a substrate according to some example embodiments of FIG. 6.

FIG. 6 is a perspective view of a substrate according to some example embodiments. In describing FIG. 6, repeated descriptions of the contents described in FIG. 4 will be omitted. FIG. 7 is a cross-sectional view of a substrate according to some example embodiments of FIG. 6. FIG. 7 is a cross-sectional view of a substrate according to some example embodiments of FIG. 6 taken along line B-B'.

The second substrate 310 of FIG. 6 may correspond to the substrate included in the second electronic device 300 of FIG. 3. According to some example embodiments, the second substrate 310 may include the first recess area Recess_1', the second recess area Recess_2', the third recess area Recess_3', and the fourth recess area Recess_4'. According to some example embodiments, the second substrate 310 may include a plurality of recess areas.

An external device connecting portions for being connected to external devices may be disposed in the first recess area Recess_1' and the third recess area Recess_3'. A main processor chip may be disposed in the second recess area Recess_2' and the fourth recess area Recess_4'.

According to some example embodiments, a metal wiring connecting the first recess area Recess_1' with the second recess area Recess_2' may be arranged in the second conductive layer L3', and a metal wiring connecting the third recess area Recess_3' with the fourth recess area Recess_4' may be arranged in the second conductive layer L3'.

Referring to FIG. 7, the first recess area Recess_1' and the third recess area Recess 3' are shown. The external device connecting portions may be disposed in the first recess area Recess_1' and the third recess area Recess_3'. According to some example embodiments, the second connectors 130*a* and 130*b* may be mounted in the first recess area Recess_1' and the third recess area Recess_3'.

In addition, the first recess area Recess_1' and the third recess area Recess_3' may not be electrically connected to each other. A portion of the second conductive layer L3' corresponding to a region between the first and third recess areas Recess_1' and Recess_3' may not include a metal wiring.

In other words, the metal wiring located in the second conductive layer L3' may be formed to connect between recess areas in which different components are disposed, and as shown in FIG. 7, the first recess area Recess_1' and the third Recess_3' in which components of the same type are disposed may not be electrically connected.

Figure 8:
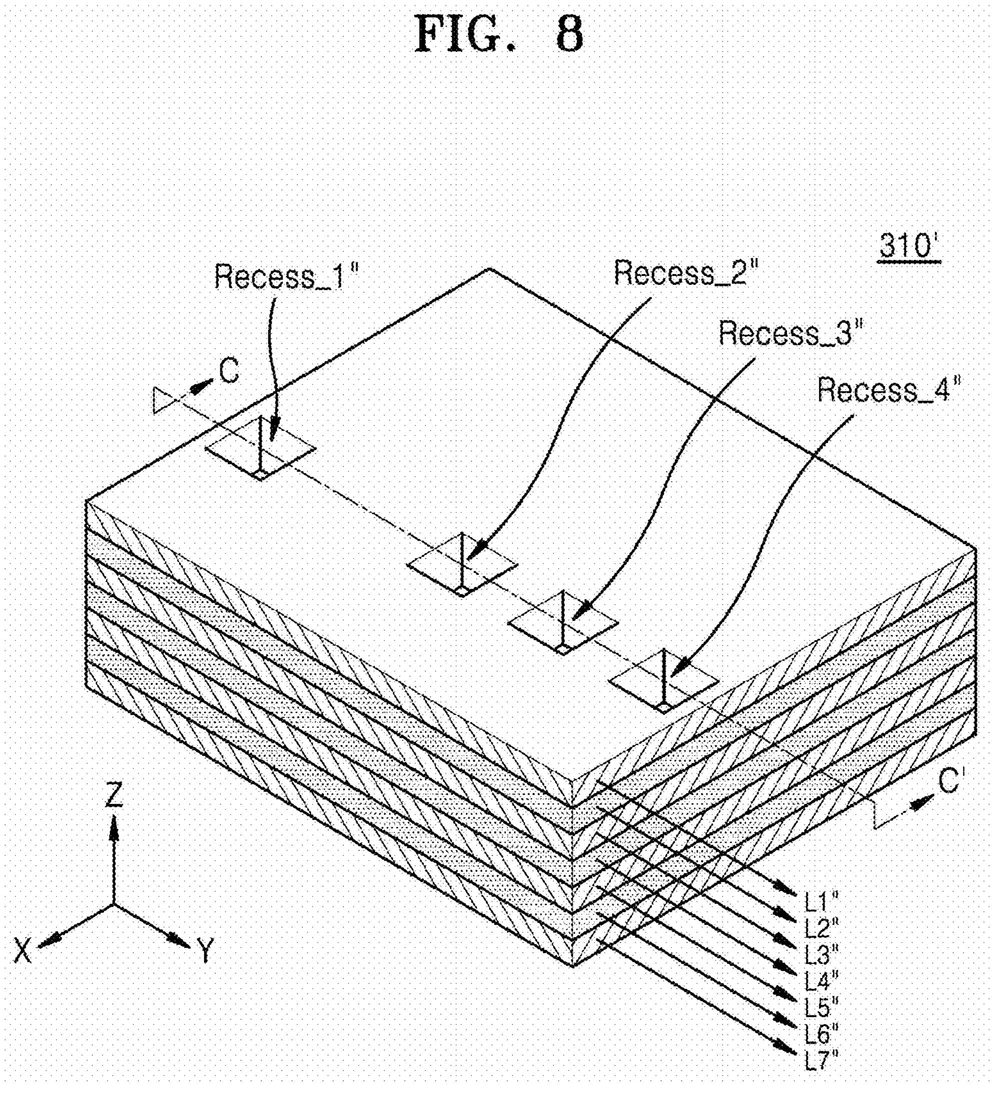
FIG. 8 is a perspective view of a substrate according to some example embodiments.
Figure 9:
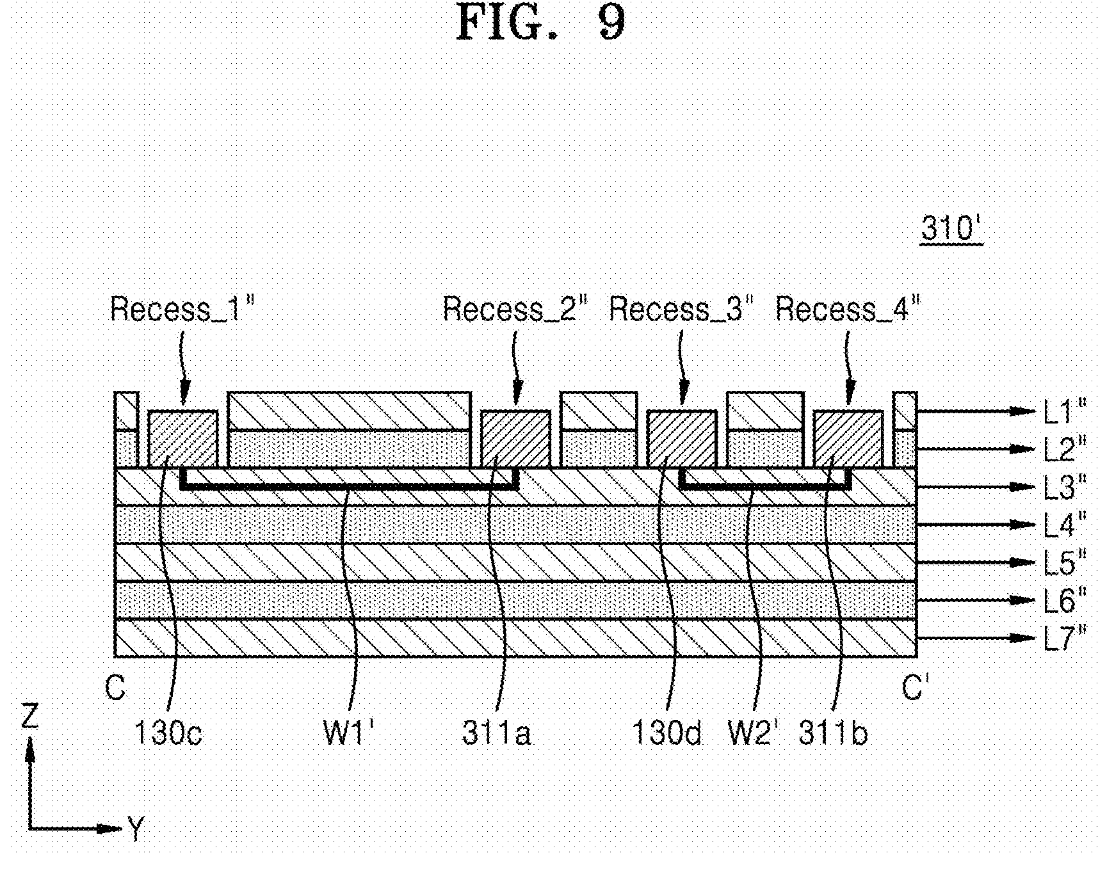
FIG. 9 is a cross-sectional view of a substrate according to some example embodiments of FIG. 8.

FIG. 8 is a perspective view of a substrate according to some example embodiments. In describing FIG. 8, repeated descriptions of the details provided with reference to FIG. 5 will be omitted. FIG. 9 is a cross-sectional view of a substrate according to some example embodiments of FIG. 8. FIG. 9 is a cross-sectional view taken along line C-C' in the perspective view of FIG. 8.

In the perspective views of the substrate according to FIGS. 4, 6, and 8 of the inventive concepts, only the first recess area and the second recess area are shown for convenience of explanation, accordingly, it should be noted that a main processor chip or an external device connecting portion disposed in the first recess area and the second recess area is not shown.

A second substrate 310' shown in FIG. 8 may be an example of the second substrate 310 included in the second electronic device 300 of FIG. 3. According to some example embodiments, the second substrate 310' may include a first recess area Recess_1", a second recess area Recess_2", a third recess area Recess_3", and a fourth recess area. According to some example embodiments, the first recess area Recess_1", the second recess area Recess_2", the third recess area Recess_3", and the fourth recess area Recess_4" may be arranged side by side in the first direction. According to some example embodiments, the first direction may be the Y-axis direction.

Referring to FIG. 9, the first recess area Recess_1" and the third recess area Recess_3" may be recess areas where external device connecting portions are disposed. The second connectors 130*c* and 130*d* may be mounted in the external device connecting portions disposed in the first recess area Recess_1" and the third recess area Recess_3", respectively. The second recess area Recess_2" and the fourth recess area Recess_4" may be recess areas where main processor chips 311*a* and 311*b* are disposed.

Referring to FIG. 9, the first recess area Recess_1" and the second recess area Recess_2" may be electrically connected to each other using a first metal wiring W1'. The third recess area Recess_3" and the fourth recess area Recess_4" may be electrically connected to each other using a second metal wiring W2'.

The first metal wiring W1' and the second metal wiring W2' may be arranged in a second conductive layer L3". The first metal wiring W1' and the second metal wiring W2' may be arranged within a range where the first wiring W1' and the second metal wiring W2' do not interfere (e.g., electrically interfere) with each other.

The structure of substrate according to some example embodiments may include a groove, that is, a recess area, formed at a location where components of a main processor chip and a high-speed interface connector are placed, and components conventionally disposed on the top surface may be disposed in an inner layer. In some example embodiments, through the structure above, a signal between the main processor chip and the high-speed interface connector can be connected without a via hole, and as there are an upper surface and a lower surface based on the signal, provide advantages in terms of a ground (GND) return path.

Figure 10:
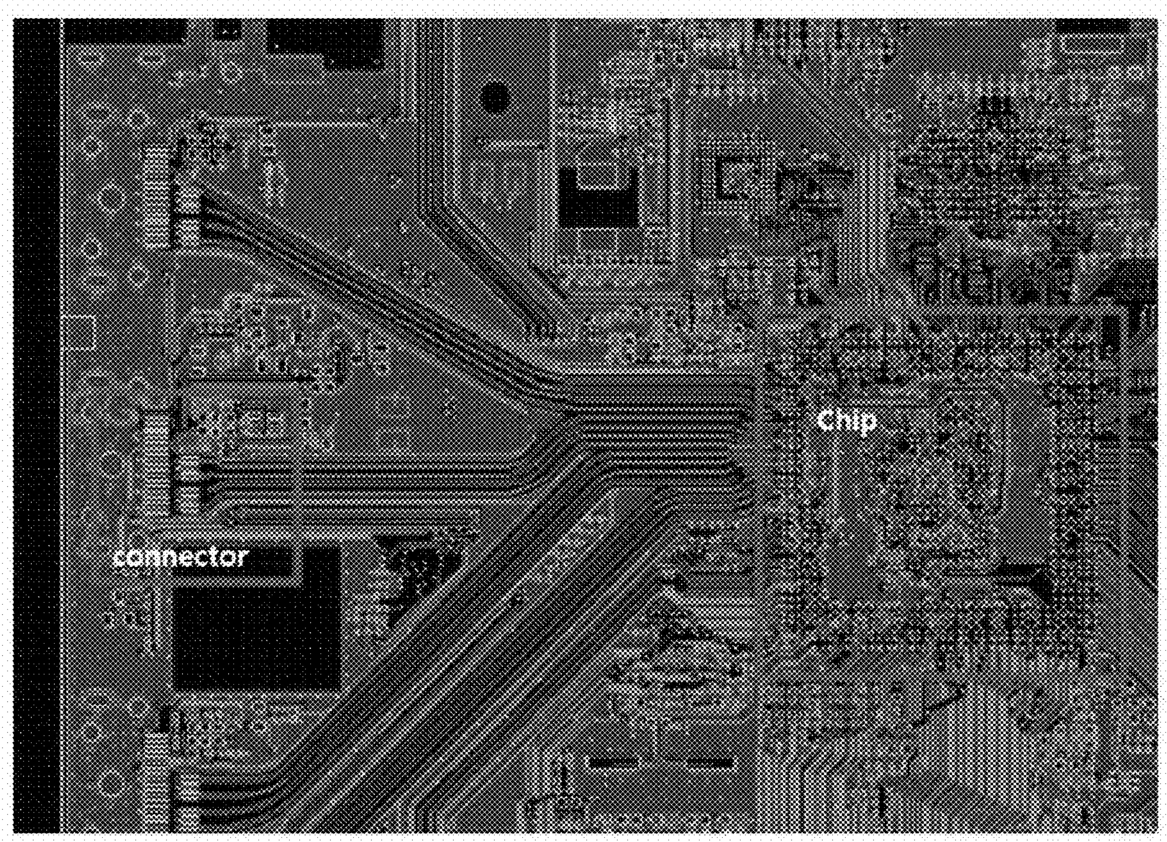
FIG. 10 is a diagram showing a substrate according to some example embodiments.

FIG. 10 is a diagram showing a substrate according to some example embodiments.

Referring to FIG. 10, a chip in which a connector and a main processor are respectively mounted in the first recess area and the second recess area of the substrate according to the inventive concepts are disclosed. The connector shown in FIG. 10 may be the first connector, and the chip shown in FIG. 10 may be a chip including the main processor.

FIG. 10 corresponds to the substrate viewed from the top, and shows that the chip including the first connector and the main processor disposed on the substrate may be provided in an inner layer.

Figure 11A:
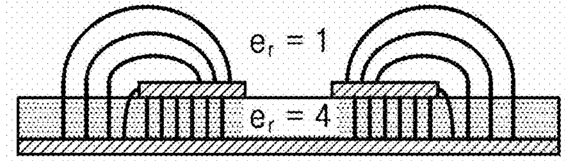
FIGS. 11A and 11B are views for explaining structural effects of a substrate according to some example embodiments.
Figure 11A:
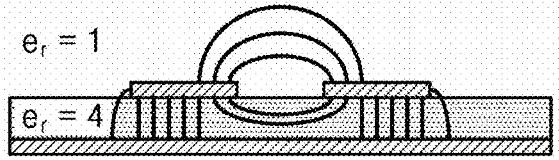
Figure 11B:
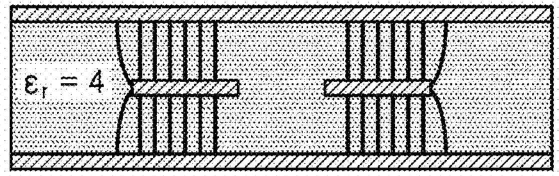
Figure 11B:
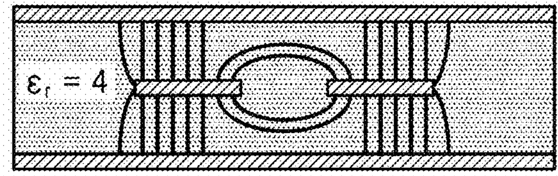

FIGS. 11A and 11B are views for explaining structural effects of a substrate according to some example embodiments. FIG. 11A is a diagram for explaining an effect according to a structure of a substrate according to the related art, for comparison, and FIG. 11B is a diagram for explaining a structural effect of a substrate according to some example embodiments.

Referring to FIG. 11A, in the substrate of the example for comparison, high-speed signals are routed on a top surface of the substrate during layout design of a product board. A via hole is to be used to process wiring in an inner layer on a general substrate. However, when a via hole is applied, since reflection due to a stub of the via hole deteriorates signal integrity characteristics, wiring is performed on the top surface of the substrate.

Referring to FIG. 11A, when wiring is processed on the top surface of the substrate, a second floor is used as a ground. In this case, based on a signal line, the ground (GND) plane is provided at the lower part and the upper part is exposed to the air, resulting in poor performance due to crosstalk and EMI issues. For example, the ground paths shown in FIG. 11A may impair performance due to crosstalk and EMI issues, at least based on the differences between air and the substrate, for example, in relative permittivity $\varepsilon_r$.

FIG. 11B is a diagram illustrating EMI caused by a substrate including a recess area and an inner layer according to some example embodiments.

All signals within the substrate may be moved by using a ground plane around the signals as a return path. Since the return path is not formed at a portion exposed to air in the upper part of the substrate, electric-magnetic field generated as the data rate increases may cause distortion of the surrounding signal. For example, the ground paths shown in FIG. 11B may improve performance due to reducing crosstalk and EMI issues, at least based on the return paths and relative permittivity $\varepsilon_r$ of the substrate.

Referring to FIG. 11B, by wiring signals in the inner layer, the references of the top and bottom surfaces of the substrate may be reinforced, thereby addressing the EMI issue. According to some example embodiments, the crosstalk and EMI of a high-speed interface of about or exactly 8 Gbps to about or exactly 48 Gbps, or more may be improved. According to some example embodiments, the cost of using a tape or film for EMI shielding may be reduced due to the effect of improving EMI. According to some example embodiments, since signal integrity characteristics is improved, restrictions on substrate size and component arrangement may be improved. According to some example embodiments, the cost of back-drilling may be reduced, which is incurred when a via hole is applied to a high-speed interface.

As above, example embodiments are disclosed in the drawings and specifications. Although some example embodiments are described using specific terms in this specification, the specific terms are only used for the purpose of explaining the technical spirit of the inventive concepts, and are not intended to limit the meaning or scope of the disclosure as recited in the patent claims. Therefore, those of ordinary skill in the art will understand that various modifications and equivalent other example embodiments are possible therefrom. Accordingly, the true technical scope of protection of the inventive concepts should be determined by the technical spirit of the appended claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the inventive concepts have been particularly shown and described with reference to example embodiments thereof, it will be understood that various changes in form and details may be made therein without departing from the spirit and scope of the following claims.

What is claimed is:

1. An electronic device system comprising:
a first electronic device including a chip and a first substrate, the first substrate comprises
a first conductive layer being an uppermost layer,
a first insulating layer under and contacting the first conductive layer, and
a second conductive layer under and contacting the first insulating layer;
a second electronic device including a second substrate; and
a data transferer including a first connector and a second connector, the data transferer configured to connect the first electronic device to the second electronic device,
the first substrate defining a first recess area and a second recess area spaced apart from the first recess area, the first recess area and the second recess area are defined by the first conductive layer and at least a portion of the first insulating layer such that a bottommost surface of the second recess area is within or below the first insulating layer and the bottommost surface of the second recess area is at or above the second conductive layer,
the chip is directly attached to the bottommost surface of the second recess area, and
the first recess area and the second recess area are at a same depth.

2. The electronic device system of claim 1,
wherein the chip includes a main processor configured to drive the first electronic device.

3. The electronic device system of claim 2,
wherein the first recess area includes a structure into which the first connector is mounted.

4. The electronic device system of claim 1,
wherein the first substrate further includes a metal wiring arranged at the second conductive layer.

5. The electronic device system of claim 4,
wherein the metal wiring is configured to electrically connect the first recess area to the second recess area.

6. The electronic device system of claim 4,
wherein the first insulating layer and the first conductive layer are above a region where the metal wiring is located.

7. The electronic device system of claim 4,
wherein the data transferer comprises a device configured to transmit data at a rate of 8 gigabytes to 48 gigabytes.

8. An electronic device comprising:
a substrate;
a main processor chip on the substrate; and
an external device connecting portion on the substrate;
the external device connecting portion in a first recess area of the substrate,
the main processor chip in a second recess area of the substrate, and
the first recess area and the second recess area being formed by recessing an uppermost first layer of the substrate and a second layer below and contacting the uppermost first layer, a bottommost surface of the first recess area and the second recess area being a third layer below and contacting the second layer.

9. The electronic device of claim 8, wherein
the first recess area and the second recess area are spaced apart from each other, and
the first recess area and the second recess area are configured to be electrically connected to each other using a conductive layer under the first recess area and the second recess area, the conductive layer being the third layer.

10. The electronic device of claim 9, wherein the substrate includes a metal wiring formed on the conductive layer below the first recess area and the second recess area, and arranged at a length corresponding to separation distance.

11. The electronic device of claim 9,
wherein a device configured to transmit data or power at a rate of 8 gigabytes to 48 gigabytes to the electronic device is connected to the external device connecting portion.

12. An electronic device comprising:
a main processor chip configured to drive the electronic device;
an external device connecting portion configured to connect the electronic device to an external electronic device; and
a substrate defining a plurality of recess areas, the substrate comprises
a first conductive layer being an uppermost layer,
a first insulating layer under and contacting the first conductive layer, and
a second conductive layer under and contacting the first insulating layer,
the plurality of recess areas comprising
at least one first recess area in which the external device connecting portion is disposed; and at least one second recess area in which the main processor chip is directly attached to a bottommost layer of the at least one second recess area, the at least one second recess area is defined by the first conductive layer and at least a portion of the first insulating layer such that a bottommost surface of the at least one second recess area is within or below the first insulating layer and the bottommost surface of the at least one second recess area is at or above the second conductive layer, a number of first recess areas being a same number as a number of second recess areas.

13. The electronic device of claim 12, wherein a depth of the at least one first recess area is same as a depth of the at least one second recess area.

14. The electronic device of claim 12, further comprising metal wirings, a number of the metal wirings corresponding to the number of first recess areas.

15. The electronic device of claim 14, wherein the metal wirings are arranged in a lower layer below the at least one first recess area and the at least one second recess area.

16. The electronic device of claim 15, wherein the metal wirings are spaced apart from each other in the lower layer.

17. The electronic device of claim 16, wherein the metal wirings are configured to electrically connect the at least one first recess area to the at least one second recess area.

18. The electronic device of claim 15, wherein the lower layer comprises a conductive layer.

19. The electronic device of claim 12, wherein a device configured to transmit data or power to the electronic device at a rate of 8 gigabytes to 48 gigabytes is connected to the external device connecting portion.

* * * * *